(12) United States Patent
Yu et al.

(10) Patent No.: US 12,707,728 B2
(45) Date of Patent: Aug. 11, 2026

(54) ELECTRICALLY CONDUCTIVE MATERIAL, PHOTOVOLTAIC MODULE, AND PREPARATION METHOD FOR ELECTRICALLY CONDUCTIVE MATERIAL

(71) Applicant: RISEN ENERGY CO., LTD., Ningbo (CN)

(72) Inventors: Zhangwen Yu, Ningbo (CN); Yafeng Liu, Ningbo (CN); Xiao Huang, Ningbo (CN)

(73) Assignee: RISEN ENERGY CO., LTD., Ningbo (CN)

( * ) Notice: Subject to any disclaimer, the term of this patent is extended or adjusted under 35 U.S.C. 154(b) by 0 days.

(21) Appl. No.: 18/872,806

(22) PCT Filed: Oct. 19, 2022

(86) PCT No.: PCT/CN2022/126158
§ 371 (c)(1),
(2) Date: Dec. 7, 2024

(87) PCT Pub. No.: WO2023/236408
PCT Pub. Date: Dec. 14, 2023

(65) Prior Publication Data

US 2025/0374688 A1 Dec. 4, 2025

(30) Foreign Application Priority Data

Jun. 8, 2022 (CN) ........................ 202210642400.7

(51) Int. Cl.
*H10F 19/90* (2025.01)
*H10F 19/80* (2025.01)

(52) U.S. Cl.
CPC ......... *H10F 19/904* (2025.01); *H10F 19/906* (2025.01); *H10F 19/80* (2025.01)

(58) Field of Classification Search
CPC ...... H10F 19/904; H10F 19/90; H10F 19/906; H10F 19/80
See application file for complete search history.

(56) References Cited

U.S. PATENT DOCUMENTS

2007/0283996 A1 12/2007 Hachtmann et al.
2010/0240166 A1 9/2010 Ishii et al.
(Continued)

FOREIGN PATENT DOCUMENTS

CN 110350047 A 10/2019
CN 114068734 A 2/2022
(Continued)

OTHER PUBLICATIONS

English machine translation for Pan et al. (CN 114497254) published May 13, 2022.*
(Continued)

*Primary Examiner* — Christina Chern

(57) ABSTRACT

A conductive material, a photovoltaic module, and a method for preparing a conductive material are provided. The conductive material is used for connecting cells, and comprises an adhesive film and a conductive wire, wherein the adhesive film has a first surface and a second surface away from each other, and the conductive wire is electrically connected to an electrode of a cell that is fixed on the first surface; at least one opening is formed in the adhesive film; and the conductive wire can electrically connect to an electrode of another cell that is fixedly arranged on the second surface via the opening.

14 Claims, 4 Drawing Sheets

(56) References Cited

U.S. PATENT DOCUMENTS

2012/0167959 A1 7/2012 Wirth et al.
2016/0056319 A1* 2/2016 Hachtmann ........... H10F 19/904
136/251

FOREIGN PATENT DOCUMENTS

CN 114497254 A * 5/2022 ........... H10F 19/906
CN 114975664 A 8/2022
EP 2624311 A1 * 8/2013 ............. H10F 19/90
EP 2629339 A1 * 8/2013 ........... H10F 19/902
WO WO2016143250 A1 9/2016

OTHER PUBLICATIONS

English machine translation for Waegli (EP 2629339) published Aug. 21, 2013.*
International Search Report of PCT/CN2022/126158.
First notice of examination opinions of CN202210642400.7.
European search report of EP22945540.7.

* cited by examiner

ELECTRICALLY CONDUCTIVE MATERIAL, PHOTOVOLTAIC MODULE, AND PREPARATION METHOD FOR ELECTRICALLY CONDUCTIVE MATERIAL

CROSS-REFERENCE TO RELATED APPLICATIONS

This application is an U.S. national phase application under 35 U.S.C. § 371 based upon international patent application No. PCT/CN2022/126158 filed on Oct. 19, 2022, which itself claims priority to Chinese patent application No. 202210642400.7, filed on Jun. 8, 2022, and titled "ELECTRICALLY CONDUCTIVE MATERIAL, PHOTOVOLTAIC MODULE, AND PREPARATION METHOD FOR ELECTRICALLY CONDUCTIVE MATERIAL", the contents of which are hereby incorporated by reference in its entirety.

TECHNICAL FIELD

The present application relates to the field of photovoltaic, in particular to a conductive material, a photovoltaic module, and a method for preparing the conductive material.

BACKGROUND

In solar cell of the related art, cells are generally connected to each other in series via conductive wire. Generally, a plurality of cells are connected to make a cell string by method of high-temperature welding. However, when a connecting wire is placed on a surface of the cell for welding, the connecting wire may irregularly move on a workbench for welding before it is welded, which may lead to inaccurate abutment.

In order to ensure the welding accuracy, currently, a main grid line or a welding pad point configured for being welded to the connecting wire is generally wider than an actual connecting wire, and even two times wider than the width of the connecting wire, leading to a great silver consumption for printing grid lines of the cell or welding pad points of the cell.

SUMMARY

A conductive material, a photovoltaic module and a method for preparing the conductive material are provided in the present application in conjunction with the embodiments of the present application.

A conductive material configured for connecting to a cell is firstly provided in the present application. The conductive material includes an adhesive film and a conductive wire. The adhesive film includes a first surface and a second surface away from each other, and the conductive wire is electrically connected to an electrode of the cell fixed on the first surface of the adhesive film; and the adhesive film is provided with at least one opening, and the conductive wire is capable of being connected to an electrode of another cell fixed on the second surface via the at least one opening.

In some embodiments, the conductive wire is capable of being bent at a right angle or an obtuse angle at the at least one first through holes and being in a step-like shaped.

In some embodiments, the at least one opening is defined by at least one first through holes being provided in the middle of the adhesive film, and the at least one first through holes are arranged in a row; and the conductive wire is capable of penetrating through the adhesive film, so that a part of the conductive wire is fixed to the first surface of the adhesive film, and the other part of the conductive wire is fixed to the second surface of the adhesive film.

In some embodiments, the adhesive film includes an intact portion and an opening portion connected to each other, and the at least one opening are provided at intervals in the opening portion; one part of the conductive wire is fixed to the intact portion on the first surface of the adhesive film, and is capable of being electrically connected to the cell fixed on the first surface of the adhesive film; and the other part of the conductive wire is fixed to the opening portion on the first surface of the adhesive film, and is capable of being electrically connected to the cell fixed on the second surface of the adhesive film via the at least one opening.

In some embodiments, the at least one opening include a second through hole penetrating through the adhesive film, and the conductive wire fixed on the first surface of the adhesive film is electrically connected to the cell fixed on the second surface of the adhesive film through the second through hole.

In some embodiments, the at least one opening include a slit, the slit includes a non-break position and a break position, the non-break position is configured for keeping the adhesive film at the slit from being separated from the adhesive film, and the conductive wire fixed on the first surface of the adhesive film is electrically connected to the cell fixed on the second surface of the adhesive film via break position of the slit.

In some embodiments, the conductive wire is bent at places corresponding to the at least one opening and inserted into the at least one opening, and at least part of the conductive wire at which the conductive wire is bent aligns with the second surface of the adhesive film.

In some embodiments, the conductive wire is bent at a joint of the intact portion and the opening portion to form a step-like structure, and the intact portion is parallel to the opening portion; and the conductive wire is bent at a right angle or an obtuse angle.

In some embodiments, a material of the adhesive film is selected from the group consisting of PE, PP, PA, TPO, TPU, silica gel, ETFE, EVA, PVB, POE, and any combination thereof; optionally, a material of the adhesive film is selected from the group consisting of composite membranes of EVA and POE, composite membranes of EVA and PET, composite membranes of POE and PET, and any combination thereof.

In some embodiments, a substrate of the conductive wire is selected from the group consisting of a copper wire, an aluminum wire, a silver wire, a copper-aluminum co-extruded alloy wire, a copper-clad aluminum alloy wire, and any combination thereof, a surface of the substrate is provided with an electrically conductive adhesive coating layer, and the electrically conductive adhesive coating layer is selected from the group consisting of a tin layer, a silver layer, a tin-lead alloy layer, a tin-lead-silver alloy layer, a tin-lead-bismuth alloy layer, and any combination thereof.

In a second aspect of the present application, a photovoltaic module is provided, which includes a cell string layer and two encapsulation layers disposed at opposite sides of the cell string layer, respectively, wherein the cell string layer includes a plurality of cells, and adjacent two of the plurality of cells are connected to each other in series by the conductive material described above.

A method for preparing a conductive material described above is further provided in the present application, which includes the following steps: providing the at least one opening on the adhesive film, wherein the adhesive film includes a first surface and a second surface away from each other; penetrating a part of the conductive wire via the at least one opening or exposing a part of the conductive wire from the at least one opening, so that at least part of the conductive wire is exposed at the second surface of the adhesive film; and fixing the part of the conductive wire that penetrating through or exposing from the at least one opening to the first side of the adhesive film or the second side of the adhesive film, and fixing the other part of the conductive wire to the first side of the adhesive film.

Details of one or more embodiments of the present application are presented in the following accompanying drawings and description in order to make other features, purposes and advantages of the present application more concise and understandable.

BRIEF DESCRIPTION OF THE DRAWINGS

In order to better describe and illustrate the embodiments and/or examples of the present application disclosed herein, reference may be made to one or more of the accompanying drawings. The additional details or examples used to describe the accompanying drawings should not be considered a limitation on the scope of any of the disclosed applications, the embodiments and/or examples currently described, and the best mode of these applications as currently understood.

In the figures, 100 represents a conductive material; 10 represents an adhesive film; 10*a* represents a first surface; 10*b* represents a second surface; 11 represents an intact portion; 12 represents an opening portion; 121 represents a second through hole; 122 represents a slit; 122*a* represents a break position; 122*b* represents a non-break position; 123 represents a first through hole; 20 represents a conductive wire; 23 represents a protrusion; 200 represents a cell; 200*a* represents a first cell; 200*b* represents a second cell; 210 represents an electrode; 300 represents a terminal conductive material; and 1 represents a cell string layer.

DETAILED DESCRIPTION

Figure 1:
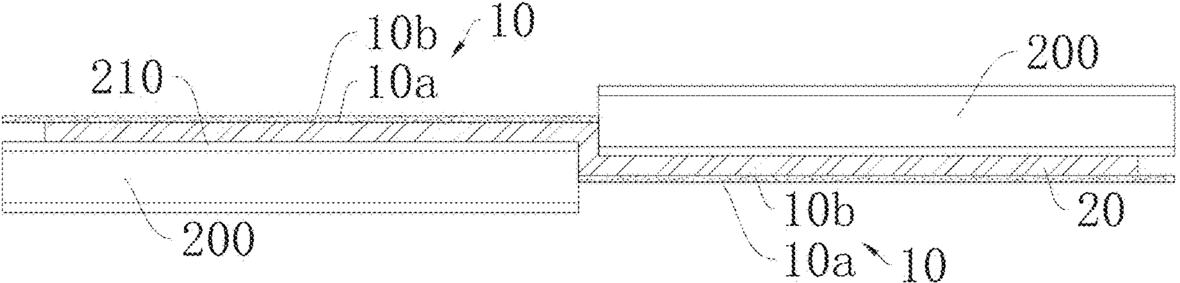
FIG. 1 is a cross-sectional view of a conductive material and cells in the first embodiment of the present application in a front view direction.

Referring to FIG. 1, a conductive material configured for connecting to a cell 200 is firstly provided in the present application. The conductive material includes an adhesive film 10 and a conductive wire 20. The adhesive film 10 includes a first surface 10*a* and a second surface 10*b* away from each other, and the conductive wire 20 is electrically connected to an electrode 210 of the cell 200 fixed on the first surface 10*a* of the adhesive film 10; and the adhesive film 10 is provided with at least one opening (not shown), and the conductive wire 20 is capable of being connected to an electrode 210 of another cell fixed on the second surface 10*b* via the at least one opening. In the present application, the conductive wire 20 is fixed to the adhesive film 10 to prepare the conductive material 100, and different cells 200 are connected in series with the conductive material 100. The conductive wire 20 is capable of being attached to the cell 200 and is electrically connected with the cell 200 by ohmic contact, and the adhesive film 10 is capable of fixing to the cell 200, so that the electrically conductive is attached to and electrically connected with the cell 200.

Since the conductive wire 20 is firstly fixed to the adhesive film 10, the conductive wire 20 will not irregularly move in the process of fixing the adhesive film 10 to the cell 200. As long as an edge of the adhesive film 10 aligns with an edge of the cell 200, the conductive wire 20 accurately abuts with and is electrically connected to the cell 200.

Since the adhesive film 10 is provided with at least one opening, in one aspect, the conductive wire 20 can be electrically connected to the cell 200 fixed on the first surface 100*a*, in another aspect, the conductive wire 20 can be electrically connected to the cell 200 fixed on the second surface 10*b*. Thus, requirement that the conductive wire 20 is simultaneously electrically connected to cells 200 at both sides of the adhesive film 10 can be met.

It should be noted that the adhesive film 10 can be fixed to the cell 200 by following methods: the adhesive film 10 is fixed to the cell 200 via an adhesion stress generated after the adhesive film 10 is heated and solidified; the adhesive film 10 is fixed to the cell 200 via an adhesion stress generated after an adhesive is solidified; optionally, the adhesive film 10 is fixed to the cell 20 via a connecting material having an adhesion stress provided on the conductive wire 20. The connecting material having the adhesion stress can be a membrane material or an adhesive tape. The adhesive film 10 can also be fixed to the cell 200 by a number of methods described above at the same time, as long as the adhesive film 10 is fixed to the cell 200, which are not limited herein.

Figure 2:
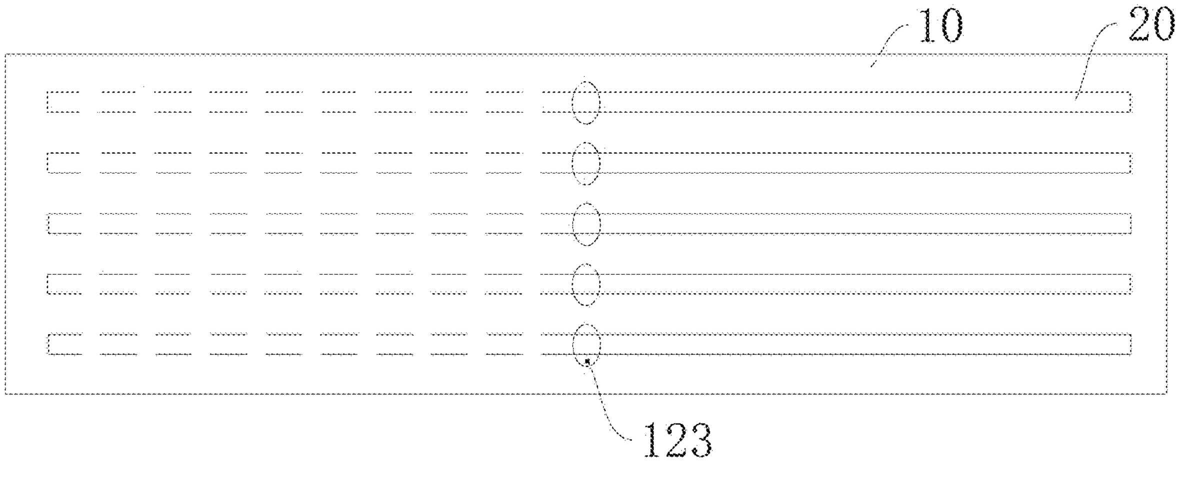
FIG. 2 is a top view of the conductive material of the embodiment in FIG. 1.

Referring to FIG. 2, in some embodiments, the conductive material includes a plurality of the conductive wires 20 parallel to each other. In related art, one conductive wire is repeatedly bent and connected to the cell. In the present application, by providing the plurality of conductive wires 20, in one aspect, the plurality of conductive wires 20 can be evenly and sufficiently electrically connected to the cell 200 without requiring to repeatedly bending the conductive wire 20 in a process for preparing the conductive material 100, so as to lowering a difficulty for preparing the conductive material; in another aspect, in the process of connecting the conductive material 100 to the cell 200, even though electrically connecting points of part of the conductive wires 20 shifts caused by irregular movements of the part of the conductive wires 20, electrically connecting points of the other part of the conductive wires 20 will not shift as the conductive wires 20 are relatively independent to each other, so that influence of irregular movement of the conductive wire 20 on abutting accuracy can be reduced.

Figure 5:
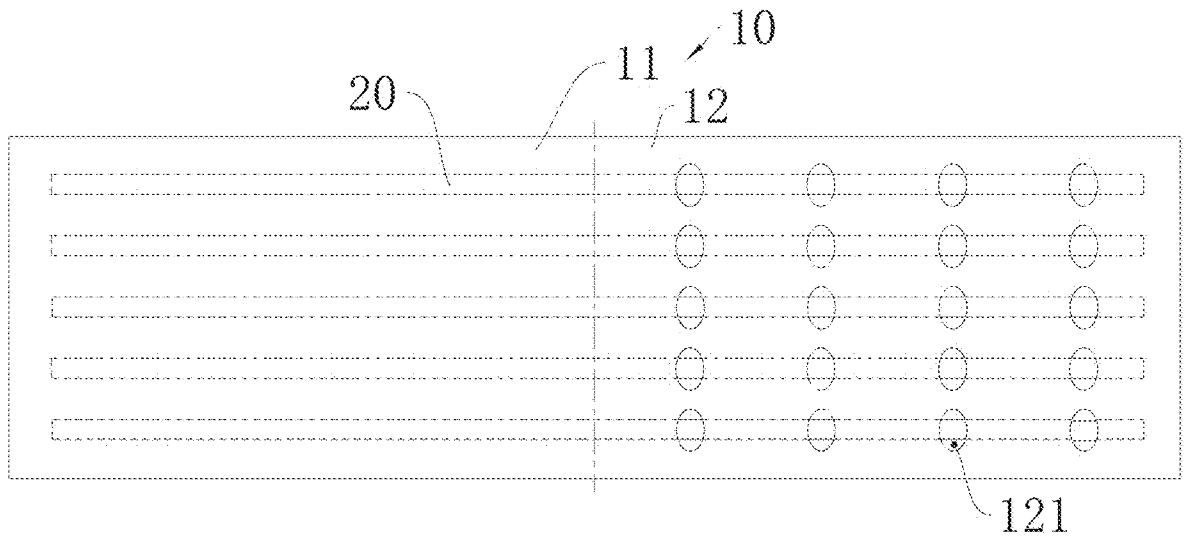
FIG. 5 is a top view of the conductive material of the embodiment in FIG. 3.
Figure 8:
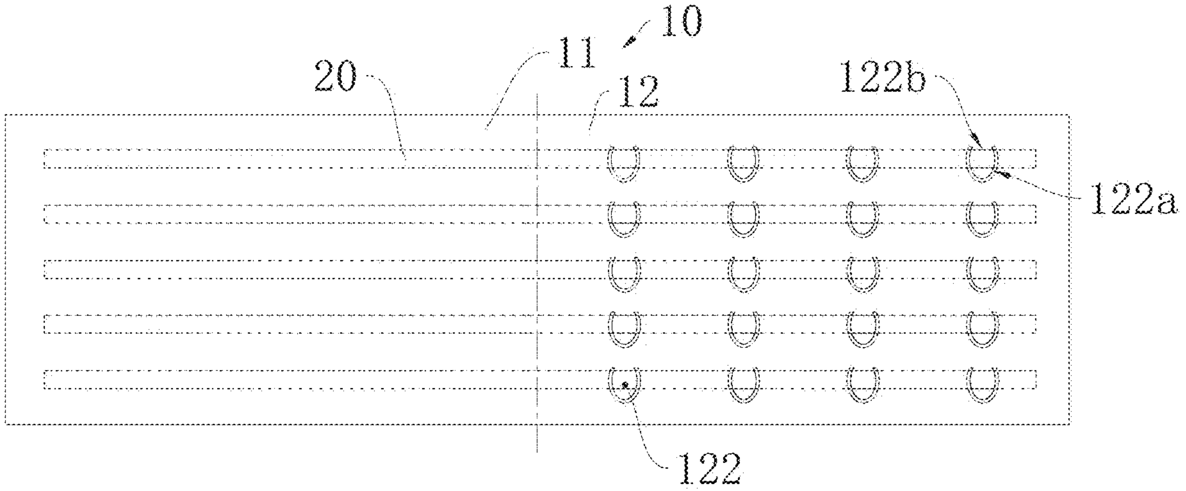
FIG. 8 is a top view of the conductive material of the embodiment in FIG. 6.

It should be noted that in FIG. 2, the electrically wires 20 represented with dotted lines indicate that the conductive wires 20 are located below the adhesive film 20, and the conductive wires 20 represented with full lines indicate that the conductive wires 20 are located upon the adhesive film 20, and FIG. 5 and FIG. 8 are in the similar way, which will not be repeated again.

In addition, since the plurality of the conductive wires 20 are parallel to each other, a spacing between adjacent two conductive wires 20 can be equal. In this way, phenomenon that one conductive wire 20 is influenced by another shifted conductive wire 20 due to unduly small spacing between adjacent two conductive wires 20 can be avoided.

Optionally, a width of the adhesive film 10 is in a range of 30 mm to 500 mm, a length of the adhesive film is in a range of 150 mm to 1500 mm, the number of the conductive wires 20 is in a range of 2 to 150, and a spacing between adjacent two of the plurality of conductive wires 20 is in a range of 10 mm to 100 mm.

As long as a spacing between conductive wires 20 is ensured and adjacent two conductive wires 20 will not interfere with each other, the conductive wires 20 can be disposed in other ways.

In some embodiments, a surface of the conductive wire 20 is provided with an electrically conductive adhesive coating layer. In a process of melting the adhesive film 10 and fixing the adhesive film 10 to the cell 200, the electrically conductive adhesive coating layer on the surface of the conductive wire 20 can be heated and melt, and electrically connected to the cell 200 fixed on the second surface **10*b*** through the openings.

In first embodiment, referring to FIG. 1 and FIG. 2, an opening is located at a middle of the adhesive film 10, the conductive wire 20 can penetrate through the adhesive film 10, so that part of the conductive wire 20 is located at the first surface **10*a* of the adhesive film 10, and the other part of the conductive wire 20 is located at the second surface 10*b* of the adhesive film 10. Optionally, the opening can be a first through hole 123**, and the first through hole can be a circular-shaped hole, an ellipse-shaped hole or a square-shaped hole.

The part of the conductive wire 20 located on the first surface **10*a* is fixed on the first surface 10*a* of the adhesive film 10, and is capable of being electrically connected to the cell 200 fixed on the first surface 10*a* of the adhesive film 10; and the other part of the conductive wire 20 fixed located on the second surface 10*b* of the adhesive film 10 is fixed to the second surface 10*b* of the adhesive film 10, and is capable of being electrically connected to the cell fixed on the second surface 10*b* of the adhesive film, so that the conductive wire 20 can be simultaneously electrically connected to the cell 200 at both sides of the adhesive film 10**.

In addition, since the conductive wire 20 penetrates through the first through hole 123 and is fixed to the second surface **10*a* of the adhesive film 10, the conductive wire 20 is electrically connected to the electrode 210 of the cell 200 by aligning the conductive wire 20 to the electrode 210 of the cell 200 along a width direction of the adhesive film 10. A relative position between the electrode 210 of the cell 200 and the conductive wire 20 along the length direction of the adhesive film 10 is not required to be adjusted, so that the difficulty for electrically connecting the cell 200** can be lowered.

In the present embodiment, a row of openings is located at the middle of the adhesive film 10. The conductive material includes a plurality of conductive wires 20. Each of the plurality of conductive wire 20 corresponds to one opening. The plurality of conductive wires 20 can penetrate through a corresponding adhesive film 10, so that part of the conductive wires 20 can be fixed on the first surface **10*a*, the other part of the conductive wires 20 can be fixed on the second surface 10*b***.

When the adhesive film 10 is a roll of adhesive film one row of openings is provided on the adhesive film 10 every at fixed intervals. A spacing between two rows of openings is a bit larger than a width of the cell 200 or a width of a solar cell slice. Optionally, a spacing between two rows of openings is greater than two times of a width of the cell 200.

Figure 3:
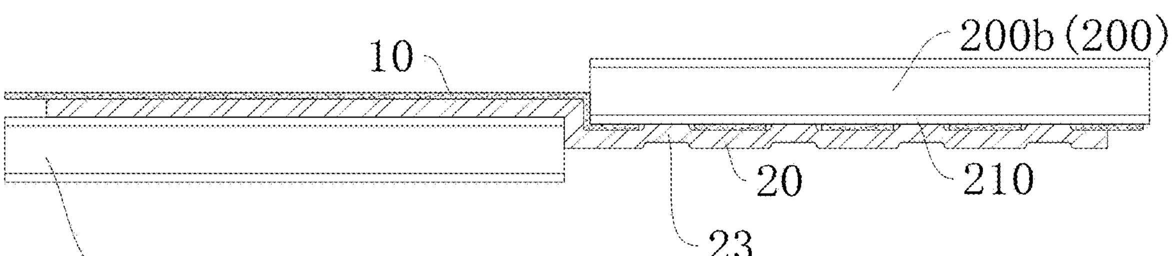
FIG. 3 is a cross-sectional view of a conductive material and cells in the second embodiment of the present application in a front view direction.
Figure 4:
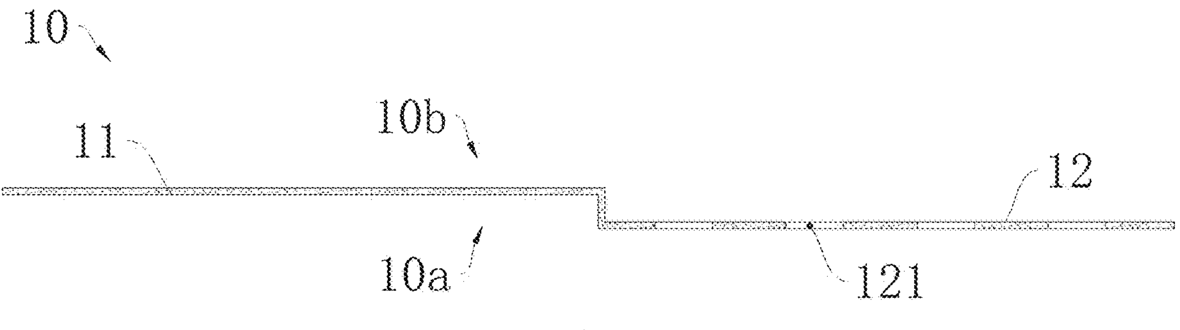
FIG. 4 is a cross-sectional view of an adhesive film of the embodiment in FIG. 3 in a front view direction.

In second embodiment and third embodiment, referring to FIG. 3 to FIG. 5, the adhesive film 10 includes an intact portion 11 and an opening portion 12 connected to each other, and the at least one opening are provided at intervals in the opening portion 12. One part of the conductive wire 20 is fixed to the intact portion 11 on the first surface **10*a* of the adhesive film 10, and is capable of being electrically connected to the cell 200 fixed on the first surface 10*a* of the adhesive film 10; and the other part of the conductive wire 20 is fixed to the opening portion 12 on the first surface 10*a* of the adhesive film 10, and is capable of being electrically connected to the cell 200 fixed on the second surface 10*b* of the adhesive film 10 via the at least one opening. The first surface 10*a* can include a first surface 10*a* of the intact portion 11 and a first surface 10*a* of the opening portion 12. The second surface 10*b* can include a second surface 10*b* of the intact portion 11 and a second surface 10*b* of the opening portion 12**.

Since a part of the conductive wire 20 is fixed to the intact portion 11 on the first surface **10*a* of the adhesive film 10, and is capable of being electrically connected to the cell 200 fixed on the first surface 10*a* of the adhesive film 10; and the other part of the conductive wire 20 is fixed to the opening portion 12 on the first surface 10*a* of the adhesive film 10, and is capable of being electrically connected to the cell 200 fixed on the second surface 10*b* of the adhesive film 10 via the at least one opening, the conductive wire 20 can be simultaneously electrically connected to cells 200 located at both sides of the adhesive film 10**.

In the present application, openings are only provided at the opening portion 12, in comparison to providing the openings on the entire adhesive film 10 in related art, the number of the openings can be reduced while it is ensured that the conductive wires 20 can be electrically connected to the cell 200 on the second surface **10*b* through the openings. Thus, the difficulty for processing the adhesive film 10** is lowered.

Optionally, the spacing between the openings is equal to the spacing between the electrodes 210 of the cell 200.

In second embodiment, referring to FIG. 4 and FIG. 5, the opening includes a second through hole 121 penetrating through the adhesive film 10, and the conductive wire 20 fixed on the first surface **10*a* of the adhesive film 10 is electrically connected to the cell 200 fixed on the second surface 10*b* of the adhesive film 10 through the second through hole 121**.

The second through hole 121 is in a foundation shape, or in a shape formed by a plurality of foundation shapes. The foundation shapes can be circle, ellipse, parallelogram, triangle or trapezoid. The plurality of second through holes 121 can be arranged in a rectangular array.

Optionally, the second through holes 121 are disposed correspondingly to the electrodes 210 of the cells 200.

Figure 6:
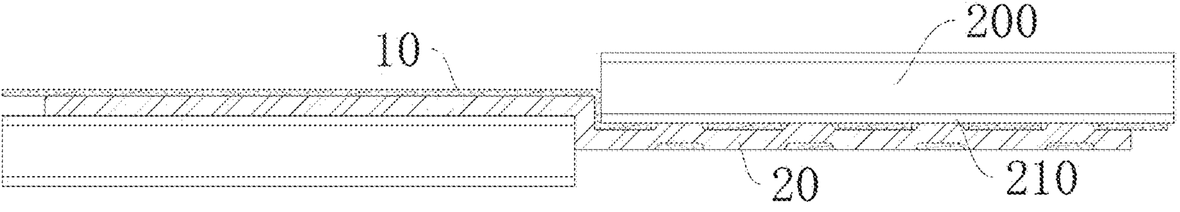
FIG. 6 is a cross-sectional view of a conductive material and cells in the third embodiment of the present application in a front view direction.
Figure 7:
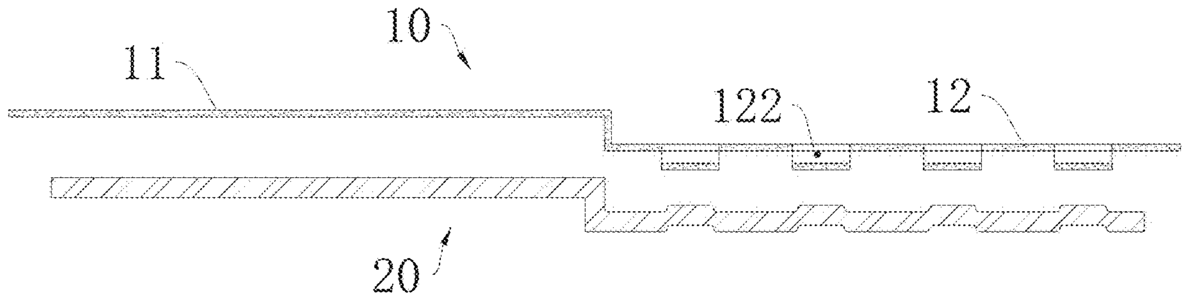
FIG. 7 is an explosive view of the conductive material in FIG. 4.

In third embodiment, referring to FIG. 6, FIG. 7 and FIG. 8, the openings include a slit 122, the slit 122 includes a non-break position **122*b* and a break position 122*a*, the non-break position 122*b* is configured for keeping the adhesive film 10 at the slit 122 from being separated from the adhesive film 10, and the conductive wire 20 fixed on the first surface 10***a* of the adhesive film 10 is electrically connected to the cell 200 fixed on the second surface 10*b* of the adhesive film 10 via break position 122*a* of the slit 122.

Since the adhesive film 10 is provided with the slit 122, the conductive wire 20 is electrically connected to the cell 200 fixed on the second surface 10*b* of the adhesive film 10 via break position 122*a* of the slit 122. In addition, the slit 122 can be fixed to the part of the conductive wire 20 away from the second surface 10*b*. Since the slit 122 is connected to the adhesive film 10 via the non-break position 122*b*, a contact area between the conductive wire 20 and the adhesive film 10 is increased. Thus, a degree of fixing stability between the conductive wire 20 and the adhesive film 10 can be improved, thereby further lowering possibility of movement of the adhesive film 10 relative to the conductive wire 20.

Referring to FIG. 8, the slit 122 is in a foundation shape, or in a shape formed by a plurality of foundation shapes, so as to facilitate processing. The foundation shapes can be circle, ellipse, parallelogram, triangle or trapezoid.

Referring to FIG. 8, a connecting line of non-break positions 122*b* of a plurality of slits 122 in a same row is parallel to a length direction of the conductive wire 20, and the break position 122*a* of each of the plurality of slits 122 is located at the same side of the non-break position 122*b* along a direction perpendicular to the length direction of the conductive wire 20. Thus, conditions that the non-break position 122*b* of the slit 122 obstructs or interferes the conductive wire 20 can be avoided, and it is ensured that the conductive wire can correspond to the break position 122*b* of the slits 122 in the same row.

Referring to FIG. 8, the plurality of slits 122 are arranged in a rectangular array, so that the plurality of rows of conductive wires 20 can be electrically connected to the electrodes 210 that are also arranged in a rectangular array on the cell 200 through the slits 122.

Referring to FIG. 3, FIG. 4, FIG. 6 and FIG. 7, the conductive wire 20 is bent and inserted into the at least one opening, and at least part of the conductive wire 20 at which the conductive wire 20 is bent aligns with the second surface 10*b* of the adhesive film 10.

In the process of fixing the conductive material 100 to the cell 200, by extruding the conductive wire 20, the conductive wire 20 is deformed and inserted into the openings, so that at least part of the conductive wire 20 at which the conductive wire 20 bends aligns with the second surface 10*b* of the adhesive film 10, thereby making the conductive wire 20 be electrically connected to the cell 200 disposed at the other side of the adhesive film 10. Each of the plurality of openings is configured for insertion of one conductive wire 20, or is configured for insertion of a plurality of conductive wires 20.

Referring to FIG. 4 and FIG. 7, the conductive wires 20 is bent at a joint of the intact portion 11 and the opening portion 12 to form a step-like structure, and the intact portion 11 is parallel to the opening portion 12; and the conductive wire 20 is bent at a right angle or an obtuse angle.

By pre-pressing and bending the conductive wire 20 to define a step-shaped structure, a structural strength of the conductive wire 20 is improved. Therefore, after the conductive material connects two cells 200, possibility of deformation of the conductive wire 20 along a gravity direction under an extrusion force caused by gravity of the cell 200 can be reduced.

In some embodiments, a material of the adhesive film 10 is selected from the group consisting of PE (polyethylene), PP (polypropylene), PA (polyamide), TPO (trimethylbenzoyldiphenyl phosphine oxide), TPU (thermoplastic polyurethane elastomer rubber), silicone, ETFE (ethylene tetrafluoroethylene copolymer), EVA (ethylene vinyl acetate copolymer), PVB (polyvinyl butyral), POE (thermoplastic elastomer with in situ polymerization of ethylene and octene), and any combination thereof. Optionally, the material of the adhesive film 10 is selected from the group consisting of a composite membrane of EVA and PEO, a composite membrane of EVA and PET (polyethylene terephthalate), a composite membrane of EPO and PET, and any combination thereof.

The adhesive film 10 can be made of other materials, as long as the hot melt nature of the adhesive film 10 is hot melt or thermosetting (crosslinking) after hot melting.

In some embodiments, the adhesive film 10 includes a glass fiber or a non-woven fabric inside. If the adhesive film 10 is unduly soft, a part of the processing steps, such as a step of fixing the adhesive film 10 to the conductive wire 20 or a step of fixing the conductive material 100 to the cell 200, may be difficult. Therefore, by providing the glass fiber or non-woven fabric inside the adhesive film 10, a flexural stiffness of the adhesive film 10 can be effectively increased, and the processing difficulty can be lowered.

In some embodiments, the adhesive film 10 is transparent or semitransparent. A color of the adhesive film 10 is a basic color. The basic color can be colorless, red, green or blue. The color of the adhesive film 10 may also be a color formed by mixing a plurality of base colors. A thickness of the adhesive film 10 is in a range of 20 μm to 500 μm.

A substrate of the conductive wire 20 is selected from the group consisting of a copper wire, an aluminum wire, a silver wire, a copper-aluminum co-extruded alloy wire, a copper-clad aluminum alloy wire, and any combination thereof, a surface of the substrate is provided with an electrically conductive adhesive coating layer, and the electrically conductive adhesive coating layer is selected from the group consisting of a tin layer, a silver layer, a tin-lead alloy layer, a tin-lead-silver alloy layer, a tin-lead-bismuth alloy layer, and any combination thereof.

A cross section of the substrate is circular-shaped, ellipse-shaped, parallelogram-shaped, triangle-shaped, trapezoid-shaped, or a shape formed by a plurality of foundation shapes. A cross-sectional area of the substrate is in a range of 0.01 $mm^2$ to 5 $mm^2$.

In some embodiments, a side of the conductive wire 20 adjacent to the adhesive film 10 is provided with a spot-shaped protrusion or a stripe-shaped protrusion. The protrusion is configured for improving a light-reflecting effect of the conductive material.

In some embodiments, the conductive material 100 can be one selected from sheet packaging, roll packaging, or spool packaging. A material of the packing box can be PET or aluminum-plastic film. A method for packing the conductive material 100 can be immediate packing or vacuum packing.

Figure 9:
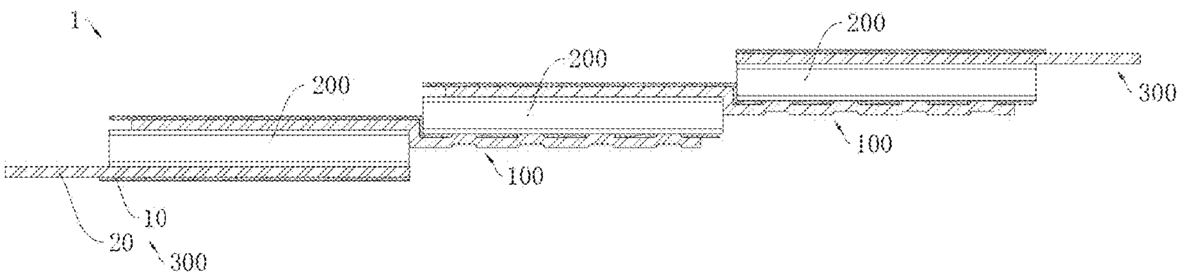
FIG. 9 is a cross-sectional view of a cell string in a photovoltaic module of the present application in a front view direction.

Referring to FIG. 9, in a second aspect of the present application, a photovoltaic module is provided. The photovoltaic module includes a cell string layer 1 and two encapsulation layers disposed at opposite sides of the cell string layer 1, respectively. The cell string layer 1 includes a plurality of cells 200, and adjacent two of the plurality of cells 200 are connected to each other in series by the conductive material 100 described above. Specifically, in the cell string layer 1, the cells 200 can be connected with each other in series by the conductive material 100 described above, and terminal conductive materials 300 are disposed at a beginning end and a tail end of the cell string layer 1.

Since the conductive material 100 is a composite material of the conductive wire 20 and the adhesive film 10, the conductive material 10 can replace a sealing adhesive film of an encapsulating material to some extent. Therefore, use of the encapsulating material in the photovoltaic module can be reduced or even replaced with the conductive material 100.

In some embodiments, the terminal conductive material 300 includes the adhesive film 10 and the conductive wire 20 being fixed at one side of the adhesive film 10. A length of the conductive wire 20 that protrudes out of the adhesive film 10 is in a range of 5 mm to 25 mm. The conductive wire 20 that protrudes out of the adhesive film 10 is configured for matching with a corresponding wire to realize electrical connection between the plurality of cell string layers 1.

Figure 10:
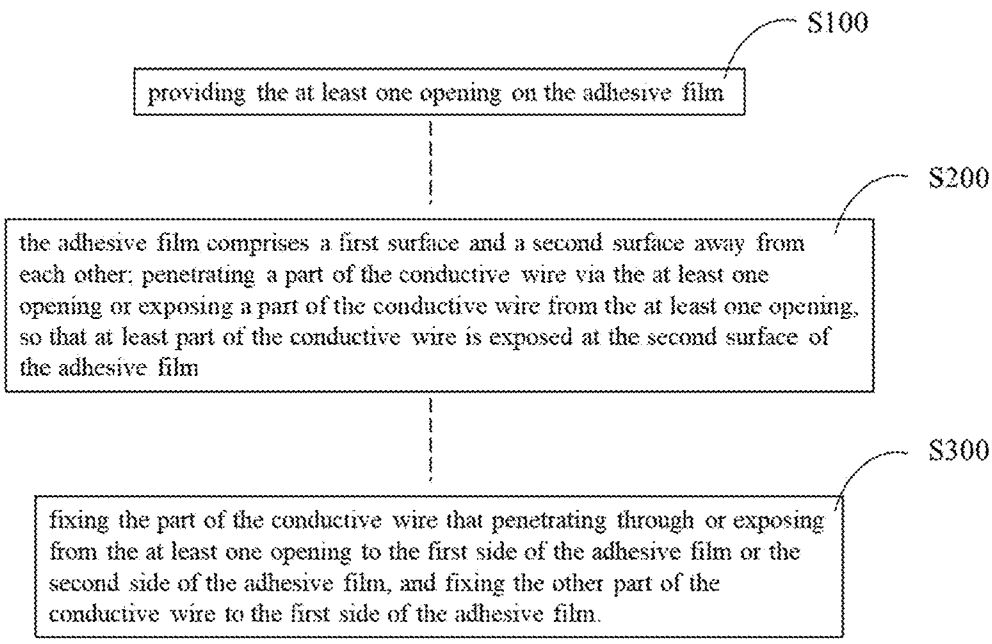
FIG. 10 is a flow diagram of a method for preparing the conductive material in the present application.

Referring to FIG. 10, the present application further provides a method for preparing the conductive material. The method includes following steps:

S100, providing the at least one opening on the adhesive film, wherein the adhesive film comprises a first surface and a second surface away from each other;

S200, penetrating a part of the conductive wire via the at least one opening or exposing a part of the conductive wire from the at least one opening, so that at least part of the conductive wire is exposed at the second surface of the adhesive film; and S300, fixing the part of the conductive wire that penetrating through or exposing from the at least one opening to the first side of the adhesive film or the second side of the adhesive film, and fixing the other part of the conductive wire to the first side of the adhesive film.

In first embodiment, referring to FIG. 1 and FIG. 2, the method for preparing the conductive material includes following steps:

- providing the one first through hole on the adhesive film, or a row of first through holes along a direction perpendicular to a drawing direction of the adhesive film on the adhesive film;
- penetrating a part of the conductive wire through the first through hole; and
- fixing the part of the conductive wire that penetrates through the first through hole on the second surface of the adhesive film, fixing the other part of the conductive wire on the first surface of the adhesive film, and obtaining the conductive material.

In second embodiment, referring to FIG. 3, FIG. 4 and FIG. 5, the method for preparing the conductive material includes following steps:

- providing a row or a plurality of rows of second through holes on the adhesive film along a direction perpendicular to a drawing direction of the adhesive film, wherein each of the second through hole in the same row are disposed at intervals along the drawing direction of the adhesive film;
- moving the conductive wires to the first surface of the adhesive film, and making each of the conductive wires be corresponding to one row of the second through holes;
- fixing the conductive wires on the first surface of the adhesive film; and
- pressing the conductive wires until the conductive wires are inserted into the second through holes and at least a part of the conductive wires aligns with the second surface of the adhesive film, and obtaining the conductive material.

In some embodiments, the second through holes can be obtained by method of punching. The number of rows of the second through holes is equal to the number of the conductive wires. The number of the second through holes in each row of the second through holes is in a range of 2 to 10, and the number and locations of the second through holes in each row of the second through holes are corresponding to electrodes printed on the cells.

In third embodiment, referring to FIG. 6, FIG. 7 and FIG. 8, the method for preparing the conductive material includes the following steps:

- providing a row or a plurality of rows of slits along a direction perpendicular to a drawing direction of the adhesive film on the adhesive film, wherein each of the slit in the same row are disposed at intervals along the drawing direction of the adhesive film;
- moving the conductive wires to the first surface of the adhesive film, and making each of the conductive wires be corresponding to one row of the slits;
- lifting the adhesive film up at the slit and making adhesive film at the slit fall spontaneously, to make the electrically conductively wire be located between the adhesive film at the slit and the adhesive slit;
- fixing the conductive wires on the first surface of the adhesive film and to the adhesive film at the slit, respectively; and
- pressing the conductive wires until the conductive wires are inserted into the break position of the slits and at least a part of the conductive wires aligns with the second surface of the adhesive film, and obtaining the conductive material.

The slits can be obtained by method of punching. The number of rows of the slits is equal to the number of the conductive wires. The number of the slits in each row of the slits is in a range of 2 to 10, and the number and locations of the slits in each row of the slits are corresponding to electrodes printed on the cells. A top surface of an ejector configured for lifting the adhesive film at the slit is circle-shaped or U-shaped.

In some embodiments, in the step of fixing the part of the conductive wire that penetrating through or exposing from the at least one opening to the first side of the adhesive film or the second side of the adhesive film, and fixing the other part of the conductive wire to the first side of the adhesive film, further includes following steps:

- gradually pressing the conductive wire to the adhesive film, and subjecting each of the conductive wires to spot heating at intervals or overall heating, so as to heat and melt the adhesive film; and
- adhering and fixing the conductive wire after the adhesive film is cooled.

In some embodiments, after the adhesive film is heated and melt, a depth of the conductive wire inserted into the adhesive film is in a range of ⅓ times to ⅔ times of a diameter of the conductive wire.

In some embodiments, in the step of fixing the part of the conductive wire that penetrating through or exposing from the at least one opening to the first side of the adhesive film or the second side of the adhesive film, and fixing the other part of the conductive wire to the first side of the adhesive film, further includes following steps:

- providing a section of glue tape, and fixing the conductive wire on the adhesive film by the section of glue tape at a certain interval.

In some embodiments, a side of the glue tape adjacent to the conductive wire includes an adhesive layer having stickness. A thickness of the adhesive layer is in a range of 2 μm to 10 μm, a width of the adhesive layer is in a range of 3 mm to 20 mm, a length direction of the section of the adhesive layer is in a range of 150 mm to 1500 mm.

In some embodiments, in the step of fixing the part of the conductive wire that penetrating through or exposing from the at least one opening to the first side of the adhesive film or the second side of the adhesive film, and fixing the other part of the conductive wire to the first side of the adhesive film, further includes following steps:

providing a section of connecting strip, and pressing the conductive wire on the adhesive film by the connecting strip at a certain interval;

heating the connecting strip to melt the connecting strip;

adhering and fixing the conductive wire on the adhesive film after the connecting strip is cooled.

In some embodiments, a material of the connecting strip can be the same as the material of the adhesive film, or different from the material of the adhesive film, as long as the hot melt nature of the connecting strip is hot melt or thermosetting (crosslinking) after hot melting. A width of the connecting strip is in a range of 3 mm to 20 mm, and a length of the section of the connecting strip is in a range of 150 mm to 1500 mm.

In some embodiments, in the step of fixing the part of the conductive wire that penetrating through or exposing from the at least one opening to the first side of the adhesive film or the second side of the adhesive film, and fixing the other part of the conductive wire to the first side of the adhesive film, further includes following steps:

The conductive material is pressed, so that the conductive material is step-shaped. The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A conductive material configured for connecting to at least two adjacent cells, comprising an adhesive film and a conductive wire;

wherein the adhesive film comprises an intact portion and an opening portion connected to each other, the opening portion comprises a first surface of the opening portion and a second surface of the opening portion, the intact portion comprises a first surface of the intact portion and a second surface of the intact portion, a first surface of the opening portion and a first surface of the intact portion are adjacent to the conductive wire, and a plurality of openings are arranged spaced from each other in the opening portion;

the at least two adjacent cells comprises a first cell and a second cell, the first cell is fixed to the first surface of the intact portion, and the second cell is fixed to the second surface of the opening portion, the conductive wire comprises a first part of the conductive wire and a second part of the conductive wire, the first part of the conductive wire is in contact with and fixed to the first surface of the intact portion, and is in contact with the first cell;

the second part of the conductive wire is in contact with and fixed to the first surface of the opening portion, the second part of the conductive wire bends to define a plurality of protrusions, the plurality of protrusions are inserted into the plurality of openings in a one-to-one correspondence manner and in contact with the second cell, wherein the plurality of openings comprise a slit, the slit comprises a non-break position and a break position, the non-break position is configured for keeping the adhesive film at the slit from being separated from the adhesive film, and the conductive wire fixed on the first surface of the adhesive film is electrically connected to the cell fixed on the second surface of the adhesive film via break position of the slit.

2. The conductive material of claim 1, wherein a connecting line of non-break positions of a plurality of slits in a same row is parallel to a length direction of the conductive wire, and the break position of each of the plurality of slits is located at the same side of the non-break position along a direction perpendicular to the length direction of the conductive wire.

3. The conductive material of claim 1, wherein each of the plurality of openings is in a foundation shape, or in a shape formed by a plurality of foundation shapes, and the foundation shape comprises circle, ellipse, parallelogram, triangle or trapezoid.

4. The conductive material of claim 1, wherein the conductive wire is bent at a joint of the intact portion and the opening portion to form a step-like structure, and the intact portion is parallel to the opening portion; and the conductive wire is bent at a right angle or an obtuse angle.

5. The conductive material of claim 1, wherein a material of the adhesive film is selected from the group consisting of PE, PP, PA, TPO, TPU, silica gel, ETFE, EVA, PVB, POE, and any combination thereof; optionally wherein a material of the adhesive film is selected from the group consisting of composite membranes of EVA and POE, composite membranes of EVA and PET, composite membranes of POE and PET, and any combination thereof.

6. The conductive material of claim 5, wherein a substrate of the conductive wire is selected from the group consisting of a copper wire, an aluminum wire, a silver wire, a copper-aluminum co-extruded alloy wire, a copper-clad aluminum alloy wire, and any combination thereof, a surface of the substrate is provided with an electrically conductive adhesive coating layer, and the electrically conductive adhesive coating layer is selected from the group consisting of a tin layer, a silver layer, a tin-lead alloy layer, a tin-lead-silver alloy layer, a tin-lead-bismuth alloy layer, and any combination thereof.

7. The conductive material of claim 6, wherein a part of the conductive wire is inserted into the adhesive film, and a depth of the conductive wire inserted into the adhesive film is in a range of ⅓ times to ⅔ times of a diameter of the conductive wire.

8. The conductive material of claim 1, wherein a plurality of the conductive wires parallel to each other are fixed on the adhesive film.

9. The conductive material of claim 8, wherein a width of the adhesive film is in a range of 30 mm to 500 mm, a length of the adhesive film is in a range of 150 mm to 1500 mm, the number of the plurality of conductive wires is in a range of 2 to 150, and a spacing between adjacent two of the plurality of conductive wires is in a range of 10 mm to 100 mm.

10. The conductive material of claim 1, wherein a side of the conductive wire adjacent to the adhesive film is provided with a spot-shaped protrusion or a stripe-shaped protrusion.

11. The conductive material of claim 1, wherein the adhesive film comprises a glass fiber or a non-woven fabric inside.

12. The conductive material of claim 1, wherein the adhesive film is transparent or semitransparent.

13. A photovoltaic module, comprising a cell string layer and two encapsulation layers disposed at opposite sides of the cell string layer, respectively, wherein the cell string layer comprises a plurality of cells, and adjacent two of the plurality of cells are connected to each other in series by a conductive material;

the conductive material comprises an adhesive film and a conductive wire;

wherein the adhesive film comprises a first surface and a second surface away from each other, and the conductive wire is electrically connected to an electrode of the cell fixed on the first surface of the adhesive film; and the adhesive film is provided with at least one opening, and the conductive wire is capable of being connected to an electrode of another cell fixed on the second surface via the at least one opening, wherein the at least one of openings comprise a slit, the slit comprises a non-break position and a break position, the non-break position is configured for keeping the adhesive film at the slit from being separated from the adhesive film, and the conductive wire fixed on the first surface of the adhesive film is electrically connected to the cell fixed on the second surface of the adhesive film via break position of the slit.

14. A method for preparing the conductive material of claim 1, comprising following steps:

providing a row of slits on the adhesive film;

moving the conductive wire to the first surface of the adhesive film and to a position corresponding to the row of the slits;

fixing the conductive wire on the first surface of the adhesive film and to the adhesive film at the row of the slits; and pressing the conductive wire until the conductive wire is inserted into break positions of the row of the slits and partially aligned with the second surface of the adhesive film, and obtaining the conductive material.

* * * * *